(12) United States Patent
Zhu

(10) Patent No.: US 8,970,298 B2
(45) Date of Patent: Mar. 3, 2015

(54) DIGITALLY CONTROLLED POWER SUPPLIES FOR AN AUDIO AMPLIFIER

(75) Inventor: Wade Zhu, Shanghai (CN)

(73) Assignee: Tempo Semiconductor, Inc., Austin, TX (US)

( * ) Notice: Subject to any disclaimer, the term of this patent is extended or adjusted under 35 U.S.C. 154(b) by 286 days.

(21) Appl. No.: 13/224,619

(22) Filed: Sep. 2, 2011

(65) Prior Publication Data

US 2013/0057342 A1     Mar. 7, 2013

(51) Int. Cl.
*H03G 3/20*     (2006.01)
*H03F 1/02*     (2006.01)

(52) U.S. Cl.
CPC ................................. *H03F 1/0222* (2013.01)
USPC ............................................. 330/136; 330/297

(58) Field of Classification Search
CPC ..................................... H03G 3/20; H03F 3/04
USPC ........................................................ 330/136, 297
See application file for complete search history.

(56) References Cited

U.S. PATENT DOCUMENTS

| 6,888,410 | B1 | 5/2005 | Li | |
|---|---|---|---|---|
| 7,782,141 | B2* | 8/2010 | Witmer et al. | 330/297 |
| 8,174,313 | B2* | 5/2012 | Vice | 330/127 |
| 2005/0077965 | A1* | 4/2005 | Li | 330/298 |
| 2010/0219888 | A1* | 9/2010 | Lesso | 330/136 |

* cited by examiner

*Primary Examiner* — Robert Pascal
*Assistant Examiner* — Khiem Nguyen
(74) *Attorney, Agent, or Firm* — Jeffrey Van Myers; Artie A. Pennington

(57) ABSTRACT

An audio playback loop circuit including an audio amplifier for amplifying an analog audio signal based on digitally controlled power supplies, and a digitally controlled power supply selection circuit for generating and selecting the digitally controlled power supplies based on a digital signal.

16 Claims, 6 Drawing Sheets

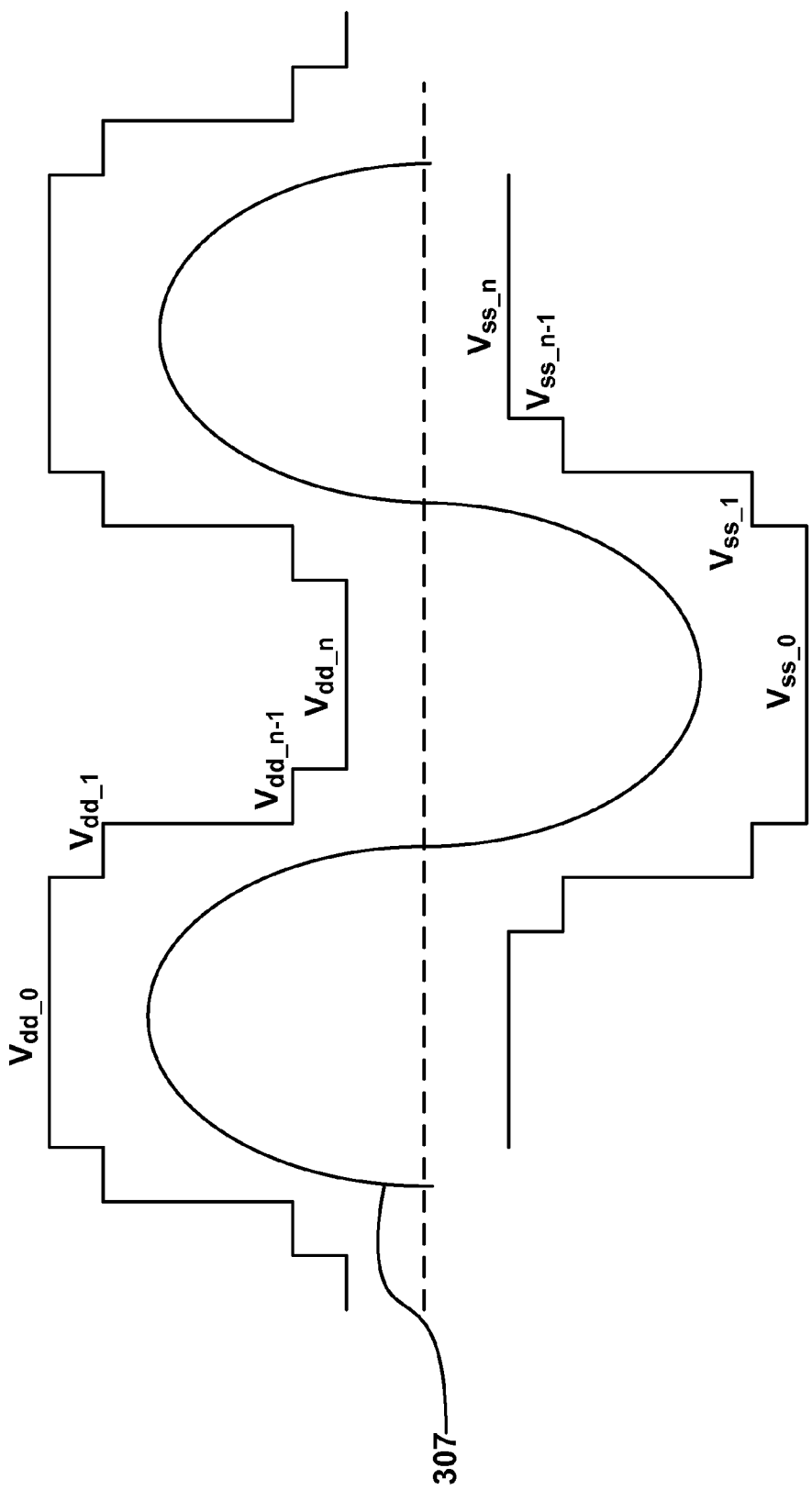

500

```
┌─────────────────────────────────────────────────────┐
│ AMPLIFY AN ANALOG AUDIO SIGNAL, BY AN AUDIO AMPLIFIER,│
│     BASED ON DIGITALLY CONTROLLED POWER SUPPLIES     │
│                         510                          │
└─────────────────────────────────────────────────────┘
                           │
                           ▼
┌─────────────────────────────────────────────────────┐
│  GENERATE THE DIGITALLY CONTROLLED POWER SUPPLIES BASED │
│                   ON A DIGITAL SIGNAL                │
│                         520                          │
│ ┌─────────────────────────────────────────────────┐ │
│ │  GENERATE THE DIGITALLY CONTROLLED POWER SUPPLIES │ │
│ │  BASED ON A MONITORING VOLTAGE AND AN ANALOG VOLTAGE│ │
│ │                       525                         │ │
│ └─────────────────────────────────────────────────┘ │
└─────────────────────────────────────────────────────┘
                           │
                           ▼
┌─────────────────────────────────────────────────────┐
│   SELECT THE DIGITALLY CONTROLLED POWER SUPPLIES BASED ON │
│                     THE DIGITAL SIGNAL               │
│                         530                          │
└─────────────────────────────────────────────────────┘

┌─────────────────────────────────────────────────────┐
│  GENERATE A MONITORING VOLTAGE BASED ON AN AMPLITUDE OF │
│                   THE DIGITAL SIGNAL                 │
│                         540                          │
└─────────────────────────────────────────────────────┘
```

FIG. 5

DIGITALLY CONTROLLED POWER SUPPLIES FOR AN AUDIO AMPLIFIER

BACKGROUND

Currently, conventional power supply selection for a Class-G audio amplifier is based on an analog signal. The analog signal is provided via a comparator. The analog based power supply selection of the Class-G amplifier typically results in less efficient and noisy supply voltage selection.

Efforts to improve the efficiency of conventional power supply selection based on analog signals rely on the use of multiple comparators for selecting a supply voltage. Production costs and power consumption rise and the inefficiency increases when there are multiple comparators for multiple power supply selections. In particular, the comparators facilitating in the power supply selection increase current consumption.

Additionally, the offsets of the comparators typically cause low decision accuracy and large delays. Thus, the Class-G amplifier using conventional power supply selection based on analog signals may generate a distorted audio output. Moreover, the comparators increase the chip size which increases the cost of the chip.

BRIEF DESCRIPTION OF THE DRAWINGS

FIG. 4 illustrates an example output of an amplifier in accordance with an embodiment of the present invention.

FIG. 5 illustrates an example of a method for digitally controlling power supply selections for an audio amplifier.

The drawings referred to in this description should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

Figure 1:
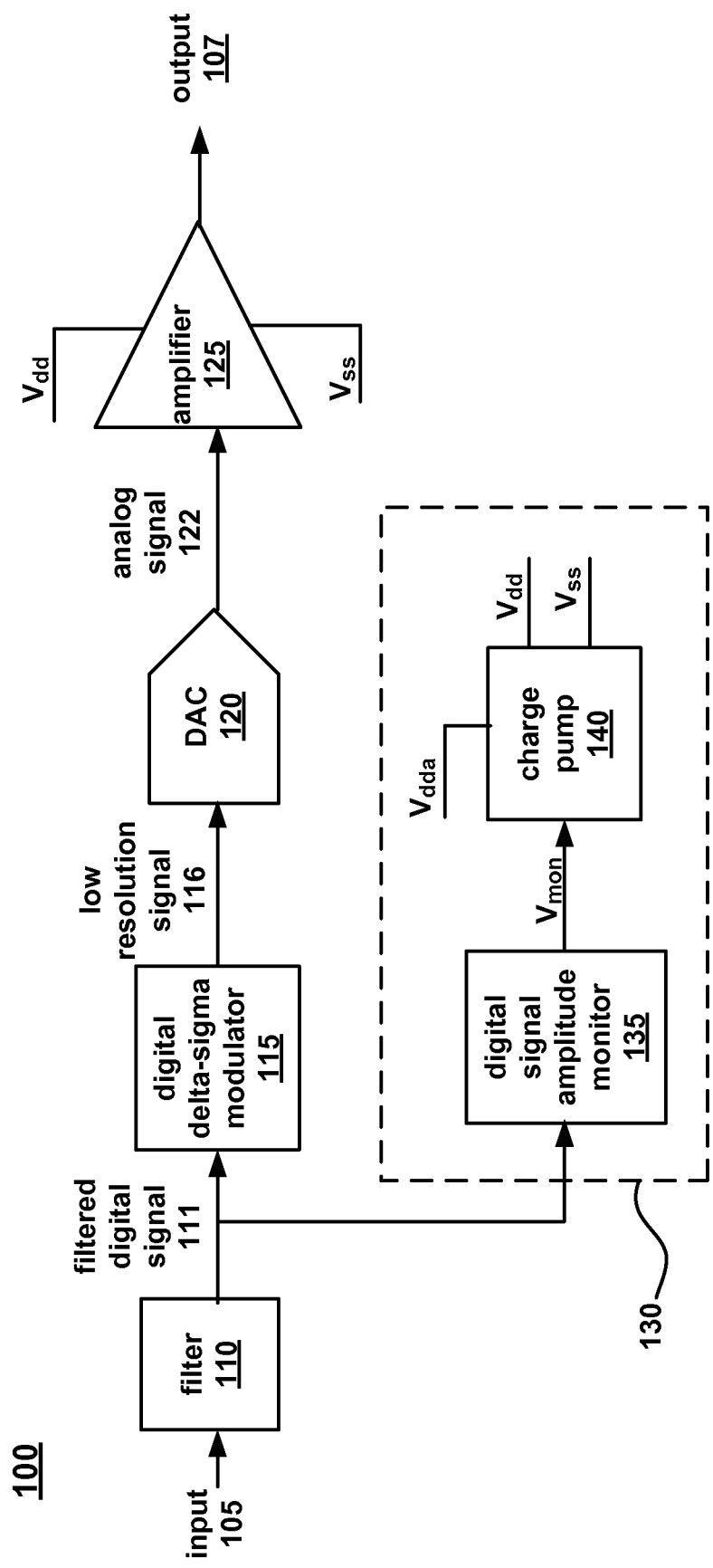
FIG. 1 illustrates an embodiment of an audio playback loop circuit.

FIG. 1 depicts an embodiment of audio playback loop circuit 100. It should be appreciated that in one embodiment, audio playback loop circuit 100 may be implemented on a single die and packaged as a "chip" or IC device.

Audio playback loop circuit 100 includes filter 110, digital delta-sigma modulator 115, digital-to-analog converter (DAC) 120, audio amplifier 125 and digitally controlled power supply selection circuit 130 (also referred to as circuit 130).

Filter 110 is configured for filtering audio input 105. Input 105 is a digital audio input, such as a 24 bit at 48 kilohertz (kHz) audio signal. In various embodiments, filter 110 is an interpolation filter, such as a Finite Impulse Response (FIR) filter.

Digital delta-sigma modulator 115 is configured for generating low resolution signal 116. In general, a digital delta-sigma modulator encodes high resolution signals into lower resolution signals. In one embodiment, digital delta-sigma modulator 115 receives filtered digital signal 111 (e.g., a 24 bit signal) and generates low resolution signal 116 (e.g., a 1 bit signal).

DAC 120 is configured for generating analog signal 122. For example, DAC 120 receives low resolution signal 116 and generates analog signal 122.

Audio amplifier 125 is configured for amplifying audio signal 122 based on digitally controlled power supplies (e.g., $V_{dd}$ and $V_{ss}$). For example, audio amplifier 125 generates amplified output 107 to drive 8, 16, or 32 ohm headphones or speakers.

In one embodiment, audio amplifier 125 is a class-G audio amplifier. A class-G amplifier is a modification of other classes of amplifiers, such as a Class-B or Class-AB amplifiers. A class-G amplifier works off the principle that musical and/or voice signals have a high peak-to-mean ratio, with most of the signal content at low levels. As such, a class-G amplifier utilizes multiple voltage supplies (e.g., a two-level or multiple-level power supplies selections) to decrease power dissipation.

In general, digitally controlled power supply circuit 130 is configured for generating and selecting digitally controlled power supplies (e.g., $V_{dd}$ and $V_{ss}$) based on a digital signal (e.g., filtered digital signal 111). In contrast, conventional power supply selection is based on an analog signal utilized by one or more comparators.

Circuit 130 includes digital signal amplitude monitor 135 and charge pump 140.

Digital signal amplitude monitor 135 is configured for generating a monitoring voltage based on an amplitude of a digital signal. For example, digital signal amplitude monitor 135 monitors the amplitude of filtered digital signal 111 and then generates monitoring voltage, $V_{mon}$, based on the monitored amplitude. Accordingly, monitoring voltage, $V_{mon}$, is dependent on the amplitude of filtered digital signal 111.

The utilization of digital signal amplitude monitor 135 eliminates the need of comparators, which are required in conventional systems. As a result, the cost and/or power consumption of audio playback loop circuit 100 may be reduced. Moreover, the chip size is reduced in comparison to the conventional system that utilizes multiple comparators.

In one embodiment, digital signal amplitude monitor 135 is a multi-level digital signal amplitude monitor, which will be described in further detail below.

Charge pump 140 is for generating the digitally controlled power supplies based on a monitoring voltage and analog voltage. For example, charge pump 140 generates digitally controlled power supplies, $V_{dd}$ and $V_{ss}$, based on monitoring voltage, $V_{mon}$, and analog voltage (or power supply), $V_{dda}$. In particular, the quantized values of monitoring voltage, $V_{mon}$, allows for charge pump 140 to select output voltage for input to audio amplifier 125.

In one embodiment, charge pump 140 is a programmable positive/negative charge pump. For example, the programmable positive/negative charge pump generates a positive voltage (e.g., $V_{dd}$) and negative voltage (e.g., $V_{ss}$) derived from monitoring voltage, $V_{mon}$. In another embodiment, charge pump 140 is a multi-level programmable positive/negative charge pump, which will be described in further detail below.

In contrast to conventional circuits (e.g., a low drop out (LDO) circuit), the digitally controlled power supply generation provides the high and low level supplies with higher efficiency.

Also, the negative voltage power supply is well suited for the capless amplifier implementation. This eliminates the need for the DC-blocking capacitor which reduces system cost and minimizes pop noise. Moreover, the comparison of inductor DC-to-DC allows for lower system cost and higher quality power supply.

Figure 2:
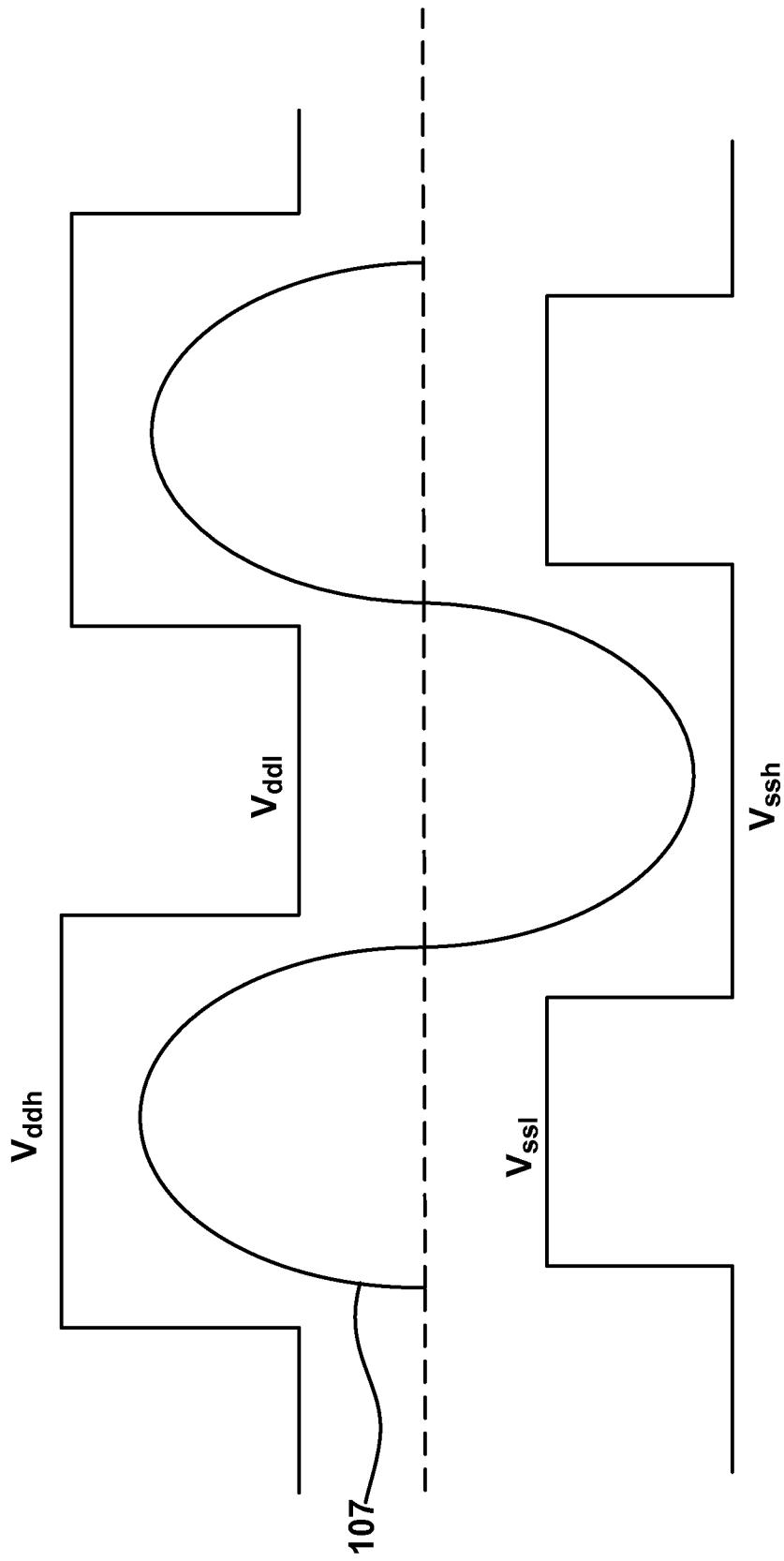
FIG. 2 illustrates an example output of an amplifier in accordance with an embodiment of the present invention.

FIG. 2 depicts an embodiment of a two-level class-G output with associated power supply selections with respect to audio playback loop circuit 100. In particular, FIG. 2 depicts output 107 of audio amplifier 125 with associated power supply selections.

For example, digitally controlled power supply selection circuit 130 provides, to audio amplifier 125, a high positive voltage power supply selection, $V_{ddh}$, and a low positive voltage power supply selection, $V_{ddl}$, to facilitate in generating output 107. Moreover, digitally controlled power supply selection circuit 130 also provides, to audio amplifier 125, a high negative voltage power supply selection, $V_{ssh}$, and a low negative voltage power supply selection, $V_{ss}$, to facilitate in generating output 107. Therefore, circuit 130 can be described as a two-level $V_{ddh}/V_{ddl}$ and $V_{ssh}/V_{ssl}$ power supply selection circuit for audio amplifier 125.

Figure 3:
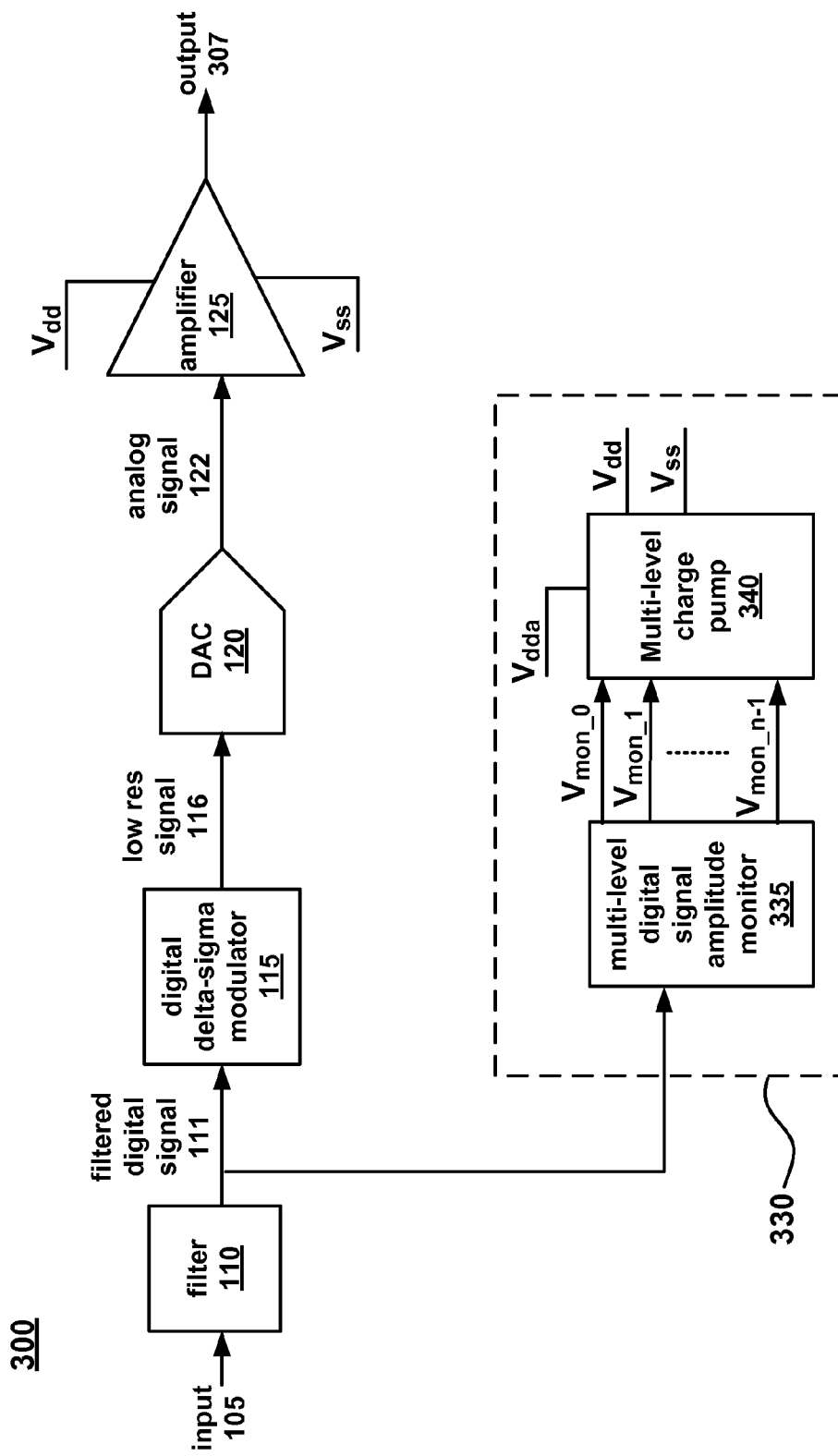
FIG. 3 illustrates an embodiment of a digitally controlled power supply selection circuit.

FIG. 3 depicts an embodiment of audio playback loop circuit 300. Audio playback loop circuit 300 functions similarly to audio playback loop circuit 100, as described above. Audio playback loop circuit 300 can be described as one embodiment of audio playback loop circuit 100.

Audio playback loop circuit 300 includes multi-level digitally controlled power supply selection circuit 330 (also referred to as circuit 330). Circuit 330 includes multi-level digital signal amplitude monitor 335 and multi-level charge pump 340.

Multi-level digital signal amplitude monitor 335, operates similarly to digital signal amplitude monitor 135, as described above. However, multi-level digital signal amplitude monitor 335 generates multiple monitoring voltages. For example, multi-level digital signal amplitude monitor 335 generates monitoring voltages, $V_{mon\_0}$-$V_{mon\_n-1}$, in response to an amplitude of a digital input (e.g., filtered digital signal 111).

Multi-level charge pump 340 is similar to charge pump 140, as described above. However, multi-level charge pump 340 generates multi-level (more than two levels) digitally controlled power supplies based on the plurality of monitoring voltages.

FIG. 4 depicts an embodiment of a multi-level class-G output with associated power supply selections with respect to audio playback loop circuit 300. In particular, FIG. 4 depicts output 307 of audio amplifier 125 with associated power supply selections.

For example, circuit 330 provides, to audio amplifier 125, a plurality of positive voltage power supply selections (e.g., $V_{dd\_0}$-$V_{dd\_n}$) to facilitate in generating output 107. Moreover, circuit 330 also provides, to audio amplifier 125, a plurality of negative voltage power supply selections (e.g., $V_{ss\_0}$-$V_{ss\_n}$) to facilitate in generating output 107.

FIG. 5 depicts a method 500 for digitally controlling power supply selections for an audio amplifier. In various embodiments, method 500 is carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In some embodiments, method 500 is performed at least by audio playback loop circuits 100 or 300, as depicted in FIGS. 1 and 3, respectively.

At 510 of method 500, an analog audio signal is amplified by an audio amplifier based on digitally controlled power supplies. For example, audio amplifier 125 (e.g., a class-G audio amplifier) amplifies analog signal 122 based on digitally controlled power supplies $V_{dd}$ and $V_{ss}$.

At 520, digitally controlled power supplies are generated based on a digital signal. For example, digitally controlled power supply selection circuit 130 (or circuit 330) generates digitally controlled power supplies $V_{dd}$ and $V_{ss}$.

In one embodiment, at 525, digitally controlled power supplies are generated based on a monitoring voltage and an analog voltage. For example, digitally controlled power supply selection circuit 130 (or circuit 330) generates digitally controlled power supplies, $V_{dd}$ and $V_{ss}$, based on monitoring voltage, $V_{mon}$, and analog voltage, $V_{dda}$.

At 530, the digitally controlled power supplies are select based on the digital signal. For example, digitally controlled power supply selection circuit 130 (or circuit 330) selects digitally controlled power supplies, $V_{dd}$ and $V_{ss}$, based on filtered digital signal 111.

Figure 6:
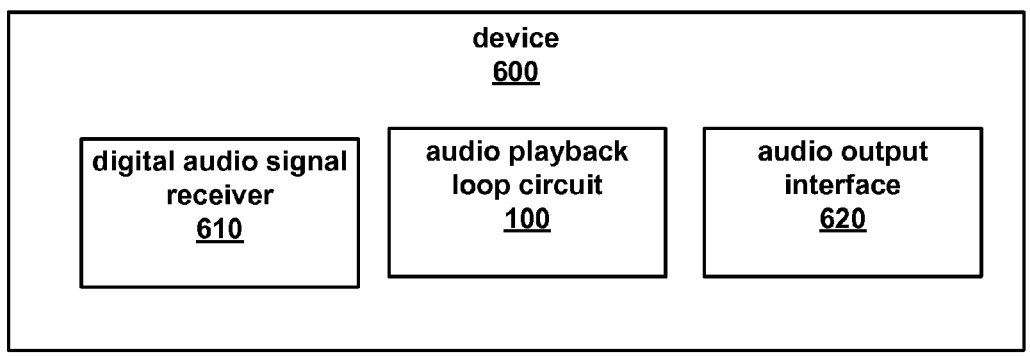
FIG. 6 illustrates an embodiment of a device including an audio playback loop circuit.

FIG. 6 depicts device 600 that utilizes audio playback loop circuit 100. Device 600 is any electronic device that is capable of providing an audio experience to a user. In other words, device 600 is any electronic device that is capable of rendering an audio signal output. For example, device 600 can be, but is not limited to, a cell phone, a PDA, MP3 player, etc.

Device 600 includes digital audio signal receiver 610, audio playback loop circuit 100 and audio output interface 620. Alternatively, in one embodiment, device 600 includes audio playback loop circuit 300.

Digital audio signal receiver 610 is configured for receiving any digital audio signal. For example, digital audio signal receiver 610 is a port for receiving digital audio input from a personal computer. In one embodiment, digital audio signal receiver 610 is a wireless receiver that wirelessly receives a digital audio signal.

Audio playback loop circuit 100 generates an amplified audio output (e.g., output 107), as described in detail above. In various embodiments, the playback loop circuit is multi-level audio playback loop circuit 300, as described in detail above.

Audio output interface 620 is configured for facilitating in the transmission of the output audio signal and/or converting the output audio signal into sound.

In one embodiment, audio output interface 620 is a headphone jack. For example, output 107 is transmitted through the headphone jack such that output 107 is converted into sound by the headphone speakers.

In another embodiment, audio output interface 620 is a speaker(s) associated with device 600 such that the output 107 is converted into sound by the speaker(s). It should be appreciated that the speakers can be separate or integrated with device 600.

In a further embodiment, audio output interface 620 is a wireless audio output transmitter. For example, the wireless audio output transmitter transmits the audio output to another device, such as a wireless speaker or a personal computer that subsequently facilitates in converting the output to into sound.

Various embodiments of the present invention are thus described. While the present invention has been described in particular embodiments, it should be appreciated that the present invention should not be construed as limited by such embodiments, but rather construed according to the following claims.

The invention claimed is:

1. An audio playback loop circuit comprising:
   an audio amplifier for amplifying an analog audio signal based on digitally controlled power supplies;
   a digital-to-analog converter for generating said analog audio signal, wherein said audio amplifier receives said analog audio signal directly from said digital-to-analog converter; and
   a digitally controlled power supply selection circuit for generating and selecting said digitally controlled power supplies based on a digital signal, wherein said audio amplifier receives said digitally controlled power supplies only from said digitally controlled power supply selection circuit, wherein said digitally controlled power supply selection circuit comprises:
      a digital signal amplitude monitor for generating a monitoring voltage based on an amplitude of said digital signal; and
      a programmable charge pump for generating said digitally controlled power supplies based on said monitoring voltage and an analog voltage.

2. The audio playback loop circuit of claim 1, wherein said audio amplifier comprises:
   a class-G audio amplifier.

3. The audio playback loop circuit of claim 1, wherein said digitally controlled power supply selection circuit comprises:
   a two-level digitally controlled power supply selection circuit.

4. The audio playback loop circuit of claim 1, wherein said digitally controlled power supply selection circuit comprises:
   a multi-level digitally controlled power supply selection circuit, wherein said multi-level is more than two levels.

5. The audio playback loop circuit of claim 1, wherein said digitally controlled power supply selection circuit further comprises:
   a multi-level digital signal amplitude monitor.

6. The audio playback loop circuit of claim 1, wherein said programmable charge pump further comprises:
   a multi-level programmable positive/negative charge pump.

7. The audio playback loop circuit of claim 1, further comprising:
   a finite impulse response filter for allowing an output of an amplitude of said digital signal.

8. The audio playback loop circuit of claim 1, further comprising:
   a digital delta-sigma modulator for receiving an input from a finite impulse response filter.

9. A device comprising:
   a digital audio signal receiver for receiving a digital audio signal;
   an audio amplifier for amplifying an analog audio signal based on digitally controlled power supplies;
   a digital-to-analog converter for generating said analog audio signal, wherein said audio amplifier receives said analog audio signal directly from said digital-to-analog converter;
   a digitally controlled power supply selection circuit for generating and selecting said digitally controlled power supplies based on a digital signal, wherein said audio amplifier receives said digitally controlled power supplies only from said digitally controlled power supply selection circuit, wherein said digitally controlled power supply selection circuit comprises:
      a digital signal amplitude monitor for generating a monitoring voltage based on an amplitude of said digital signal; and
      a programmable charge pump for generating said digitally controlled power supplies based on said monitoring voltage and an analog voltage; and
   an audio output interface.

10. The device of claim 9, wherein said audio amplifier comprises:
   a class-G audio amplifier.

11. The device of claim 9, wherein said digitally controlled power supply selection circuit comprises:
   a multi-level digitally controlled power supply selection circuit.

12. The device of claim 9, wherein said digitally controlled power supply selection circuit further comprises:
   a multi-level digital signal amplitude monitor.

13. The device of claim 9, wherein said audio output interface comprises:
   a headphone jack.

14. The device of claim 9, wherein said audio output interface comprises:
   a speaker.

15. A method for digitally controlling power supply selections for an audio amplifier, said method comprising:
   receiving an analog audio signal, by an audio amplifier, directly from a digital-to-analog converter;
   amplifying said analog audio signal, by said audio amplifier, based on digitally controlled power supplies;
   generating said digitally controlled power supplies based on a digital signal by a digitally controlled power supply selection circuit, wherein said generating said digitally controlled power supplies is further based on an analog voltage and a monitoring voltage;
   selecting said digitally controlled power supplies based on said digital signal by said digitally controlled power supply selection circuit; and
   directly receiving said digitally controlled power supplies by said audio amplifier only from said digitally controlled power supply selection circuit.

16. The method of claim 15, further comprising:
   generating a monitoring voltage based on an amplitude of said digital signal.

* * * * *